(12) United States Patent
Blodgett (10) Patent No.: US 6,268,768 B1
(45) Date of Patent: Jul. 31, 2001

(54) AMPLIFIER HAVING LINEAR CHARACTERISTICS

(75) Inventor: James Russell Blodgett, Derry, NH (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/450,993

(22) Filed: Nov. 29, 1999

(51) Int. Cl.[7] .................................................... H03F 1/36
(52) U.S. Cl. .................... 330/107; 330/109; 330/124 R; 330/149
(58) Field of Search .................................. 330/107, 109, 330/124 R, 149, 295

(56) References Cited

U.S. PATENT DOCUMENTS

| 3,678,403 | * | 7/1972 | Craft | 330/124 R |
| 4,187,471 | * | 2/1980 | Shimoji et al. | 330/124 R |
| 4,656,434 | * | 4/1987 | Selin | 330/149 |
| 5,675,285 | | 10/1997 | Winters | 330/124 R |
| 5,917,375 | | 6/1999 | Lisco et al. | 330/151 |

FOREIGN PATENT DOCUMENTS

0040046 * 1/1979 (JP) ...................................... 330/107

OTHER PUBLICATIONS

J.K. Cavers, "Amplifiers Linearization Using a Digital Preedistorter with Fast Adaptation and Low Memory Requirements", *IEEE Transactions on Vehicular Technology,* vol. 39, No. 4, pp. 374–382, Nov., 1990.

* cited by examiner

Primary Examiner—Michael B Shingleton (57) ABSTRACT

An amplifier system includes an input circuit loop and an output circuit loop coupled to a balanced amplifier assembly. The balanced amplifier assembly provides both a nonlinear distortion signal component and a corrective precursor signal component for enhanced and virtually complete cancellation of the nonlinear distortion signal component. A phase shifter facilitates phase shifting in a feedback signal path between the output circuit loop and the input circuit loop to form a corrective signal component from the corrective precursor signal.

20 Claims, 5 Drawing Sheets

AMPLIFIER HAVING LINEAR CHARACTERISTICS

FIELD OF THE INVENTION

This invention relates to an amplifier having linear characteristics for use in a wireless communications system.

BACKGROUND

A linear amplifier produces an output signal which is proportional to the input signal in amplitude. If an amplifier provides inadequate linearity, the performance of the amplifier may be degraded by distortion components in the output signal. For example, distortion components may represent intermodulation products formed during the amplification process as different frequency components of the input signal interact with each other. Non-linear performance of an amplifier becomes a particularly acute problem where the amplifier is driven near saturation. If a power amplifier of a wireless communications system is driven near saturation, the bandwidth of the amplified signal may expand, causing adjacent channel interference. Thus, power amplifiers for wireless communications systems, such as personal communication services (PCS) systems, characteristically require some form of linearization to enhance the linear performance of the power amplifier.

The linearity of power amplifiers in a wireless system have been enhanced by feed forward, data pre-distortion, and signal pre-distortion techniques. The feed forward technique of linearization extracts distortion products from an output signal of a main amplifier. A corrective amplifier amplifies a phase-shifted version of the distortion products. The amplified, phase-shifted version is combined with the output signal to cancel out the distortion products from the output signals. However, the feed forward technique can require complex circuitry with extra components and critical adjustments that may tend to reduce actual circuit performance from theoretical performance.

Data pre-distortion considers a data constellation of input data modulating the input signal fed into a power amplifier. The data constellation is pre-distorted in order to compensate for any distortion subsequently introduced by the power amplifier. However, data pre-distortion techniques depend on the modulation scheme so that, for each different modulation scheme the algorithm must be adjusted or re-written to deliver appropriate improvements in the linearization.

The signal pre-distortion method generates a pre-distorted signal for introduction to the input of a primary amplifier. The primary amplifier produces internal nonlinear distortions, which are canceled by the pre-distorter to yield a relatively undistorted signal at the output of the primary amplifier. the signal pre-distortion technique relies on the assumption that the primary amplifier and a secondary amplifier operate in a sufficiently equivalent manner to provide adequate cancellation of the nonlinear distortion. The ideal pre-distortion signal would have a distortion signal component that is inverted in phase, but otherwise perfectly identical to the distortion component introduced by the other amplifier. However, in practice the primary and secondary amplifiers tend to have slightly different characteristics that result in incomplete cancellation of nonlinear products of the primary amplifier. Examples of different characteristics that may detract from linearity-enhancing techniques include gain versus frequency, phase linearity, temperature variation, amplitude modulation/phase modulation conversion or other operational disparities between the amplifiers. The differences between the amplifiers in the signal pre-distortion technique and feed-forward technique may become apparent when a power amplifier is fluctuated over a temperature range or cycled over a range of different input magnitudes. When co-dependent amplifiers for linearity enhancement operate under extreme environmental conditions or at the fringes of electrical specifications, the linearity of a power amplifier assembly may be degraded. Thus, a need exists for an amplification system that provides linear performance characteristics over various extended temperature and dynamic input ranges of input signals.

SUMMARY OF THE INVENTION

In accordance with the invention, an amplifier system for a wireless communications device provides linearity compensation that is well-suited for operation over fluctuations in environmental conditions and dynamic ranges of input signals because of amplification symmetry in the amplifier system. The amplifier system includes an input circuit loop and an output circuit loop coupled to a balanced amplifier assembly. The balanced amplifier assembly provides both a nonlinear distortion signal component and a corrective precursor signal component for enhanced cancellation of the nonlinear distortion signal component. A phase shifter facilitates phase shifting in a feedback signal path between the output circuit loop and the input circuit loop to form the corrective signal component (e.g., pre-distortion signal component) from the corrective precursor signal component.

DETAILED DESCRIPTION OF A PREFERRED EMBODIMENT

Figure 1:
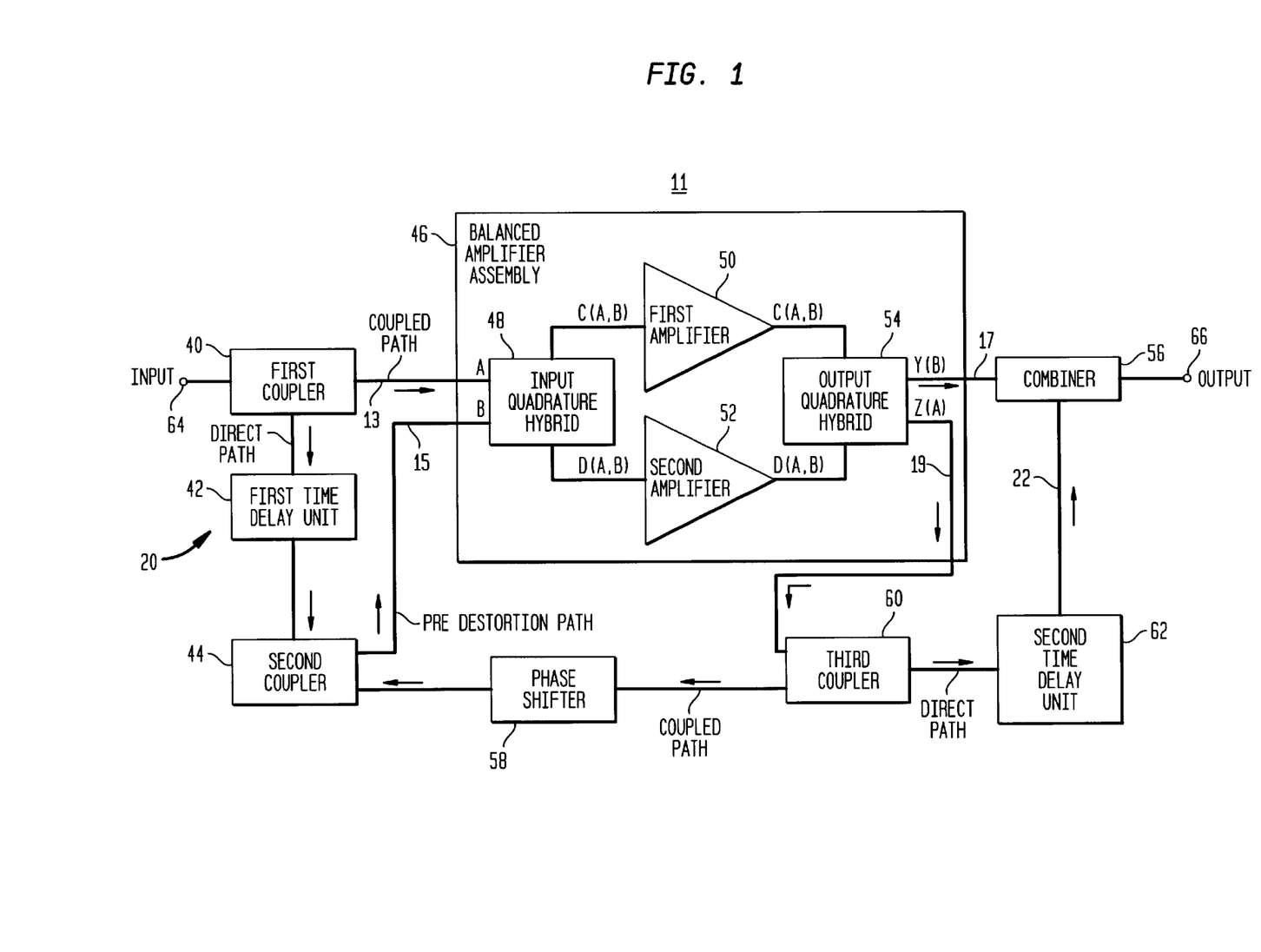
FIG. 1 is a block diagram of an amplifier system in accordance with the invention.

In accordance with the invention, FIG. 1 discloses a block diagram of an amplifier system 11. The amplifier system 11 receives an input signal at an input 64 and provides an amplified replica of the input signal at an output 66. The amplifier system 11 includes an input circuit loop 20 and an output circuit loop 22 coupled to input ports (13, 15) of a balanced amplifier assembly 46 and output ports (17, 19) of the balanced amplifier assembly 46, respectively. The output circuit loop 22 is coupled to the input circuit loop 20 to provide a feedback path through a phase shifter 58.

The input circuit loop 20 includes a first coupler 40, a first time delay unit 42, and a second coupler 44. The first coupler 40 is coupled to a first time delay unit 42 and input port 13. In turn, the first time delay unit 42 is coupled to the second coupler 44, which receives feedback from the phase shifter 58 and the balanced amplifier assembly 46. The output circuit loop 22 includes a combiner 56, a second time delay unit 62, and a third coupler 60. The third coupler 60 is coupled to the phase shifter 58, the second time delay unit 62, and the balanced amplifier assembly 46 at output port 19. In turn, the second time delay unit 62 is coupled to the combiner 56, with the combiner 56 being further coupled to output port 17.

The balanced amplifier assembly 46 includes an input quadrature hybrid 48 coupled to inputs of a first amplifier 50 and a second amplifier 52. As used herein, a nonlinear signal component shall include intermodulation products or any other nonlinear amplification artifact produced by the first amplifier 50, the second amplifier 52, or both. In a preferred embodiment, the first amplifier 50 and the second amplifier 52 have a substantially equivalent gain. Outputs of the first and second amplifier ( 50, 52) are coupled to an output quadrature hybrid 54. The input quadrature hybrid 48 and the output quadrature hybrid 54 have a phase relationship such that if the input ports (13, 15) of the input quadrature hybrid 48 separately receive a first signal and a second signal, amplified versions of the first and second signals appear separately at the output ports (17, 19) of the output quadrature hybrid 54. The input ports of the balanced amplifier assembly 46 include a first input port 13 and a second input port 15. The output ports of the balanced amplifier assembly 46 include a first output port 17 and a second output port 19.

The balanced amplifier assembly 46 emulates two distinct virtual amplifiers: (1) a first virtual amplifier amplifies a signal inputted into the first input port 13 and outputs the signal at the second output port 19 and (2) a second virtual amplifier amplifies a signal inputted into the second input port 15 and outputs the signal at the first output port 17. The first virtual amplifier provides a pre-distortion signal component for the second virtual amplifier via the phase shifter 58. A pre-distortion signal component is a corrective signal component adapted for input into an amplifier to compensate for the amplifier's nonlinearity. The pre-distortion signal component may have any suitable amplitude level and has an opposite phase to the nonlinear signal component produced by amplification in the amplifier. However, other than being inverted and possibly different in amplitude, the pre-distortion signal component has substantially identical signal characteristics to the nonlinear signal component.

The second virtual amplifier provides a feed-forward signal component at the combiner 56 for substantially canceling out a nonlinear distortion component in a desired signal. The feed-forward signal component is a corrective signal component adapted for the last cancellation of nonlinear signal component prior to an output 66 of the amplifier system 11. The feed-forward signal component has an opposite phase with respect to the nonlinear signal component produced by amplification in the balanced amplifier assembly 46, but otherwise the feedforward signal component has substantially identical signal characteristics to the nonlinear signal component. The feed-forward signal component and the nonlinear signal component preferably have generally the same amplitude to promote substantially complete cancellation of the nonlinear signal component; hence, a substantially linear desired signal at output 66.

Advantageously, both of the actual physical amplifiers, the first amplifier 50 and the second amplifier 52, contribute toward the provision of the corrective precursor signal component used to derive the corrective signal component (e.g., the feed-forward signal component or the pre-distortion signal component) and the nonlinear distortion signal component itself such that complete identity between the characteristics of the corrective signal component and nonlinear distortion signal component allows virtually complete cancellation of the nonlinear distortion signal component at the output. Thus, the amplifier system 11 is well-suited for providing consistent linearity compensation despite the types of extreme fluctuations in environmental conditions or electrical conditions, which may be called for in wireless infrastructure specifications.

In accordance with the invention, the amplifier system 11 provides linearity enhancement by a pre-distortion technique and a feed-forward technique. The pre-distortion technique is best illustrated by the signal flow shown in FIG. 2, whereas the feed-forward technique is best illustrated by the signal flow shown in FIG. 3.

Figure 2:
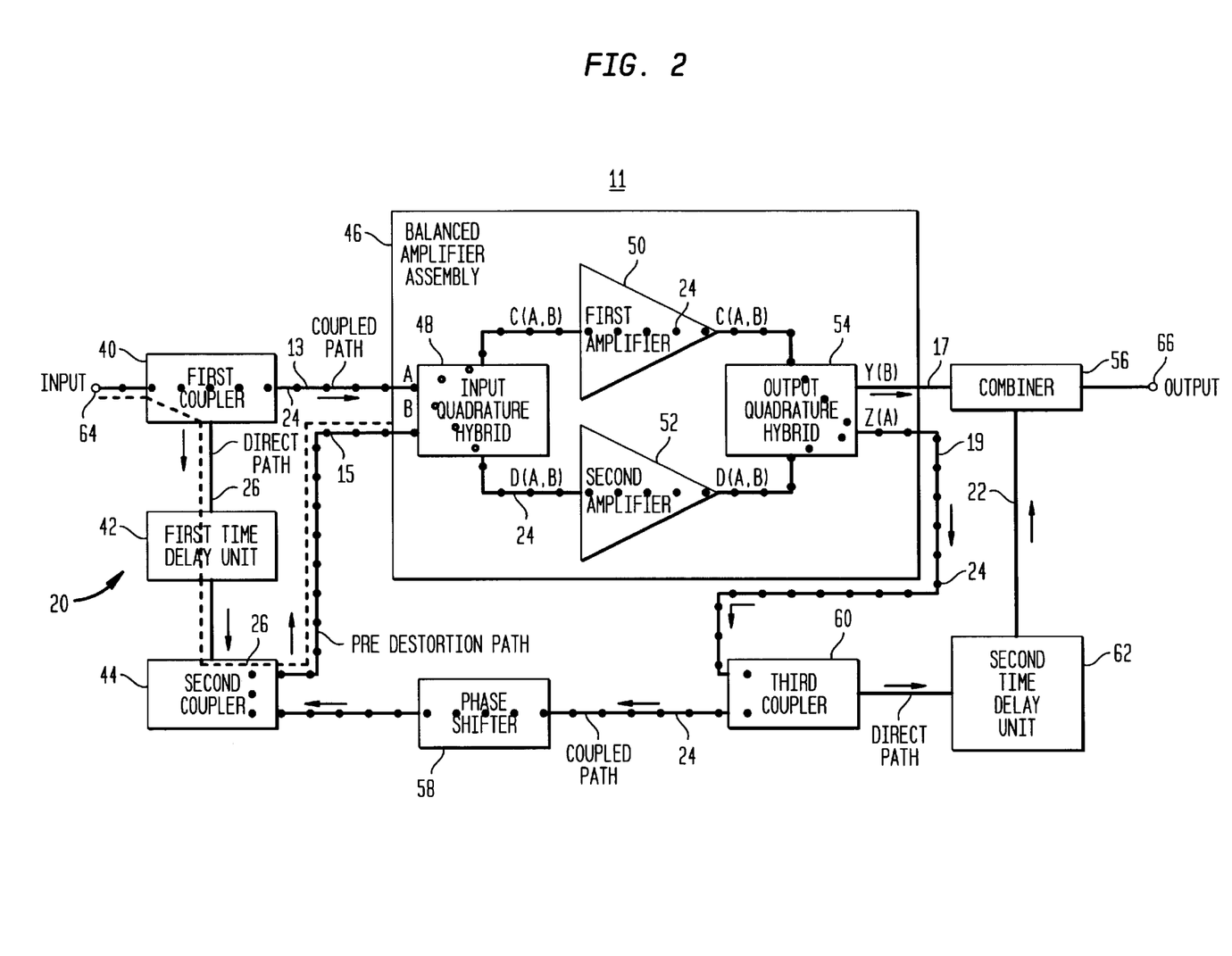
FIG. 2 shows signal paths associated with a pre-distortion linearization technique in accordance with the invention.

The pre-distortion technique involves an unamplified signal path 26 (illustrated by the dashed line) and an amplified signal path 24 (illustrated by the dotted line). The unamplified signal path 26 starts at the input 64 and traverses through the first coupler 40, the first time delay unit 42, and the second coupler 44. The unamplified signal path 26 ends in the vicinity of the second input port 15 of the balanced amplifier assembly 46.

The amplified signal path 24 starts at the input 64 and traverses through the first coupler 40 and enters the balanced amplifier assembly 46 at the first input port 13. In the input quadrature hybrid 48, the amplified signal path 24 is split such that the amplified signal path 24 includes a path through both the first amplifier 50 and the second amplifier 52. In the output quadrature hybrid 54, the amplified signal path 24 is combined such that the amplified signal path 24 emerges from the second output port 19 of the balanced amplifier assembly 46. The amplification between the first input port 13 and the second output port 19 may be referred to as the first virtual amplifier. From the second output terminal 19, the amplified signal path 24 extends through the third coupler 60, the phase shifter 58, and the second coupler 44. The amplified signal path 24 ends in the vicinity of the second input port 15 of the balanced amplifier assembly 46.

The amplified signal that emerges from the second output port 19 has a precursor corrective signal component of at least the amplitude of the nonlinear distortion component produced by the balanced amplifier assembly 46. In a preferred embodiment, the second output port 19 has a corrective precursor signal component that facilitates a corrective signal component (i.e., a pre-distortion signal component) at the second input port 15 with at least twice the amplitude of the nonlinear pre-distortion component produced by the balanced amplifier assembly 46. In practice, a variable attenuator (not shown) may be connected in series with the phase shifter 58 in the feed-back signal path to adjust the amplitude of the distortion signal component internally for optimum signal cancellation within the balanced amplifier assembly 46.

The phase shifter 58 adjusts the phase of the corrective precursor signal component to be approximately one-hundred and eighty degrees out of phase with respect to the nonlinear distortion component produced by amplification of the balanced amplifier assembly 46. The phase-shifted signal at the output of the phase shifter 58 consists of the amplified signal and a corrective signal component, derived from the corrective precursor signal component at the phase shifter's input. The corrective signal component or pre-distortion signal component cancels at least a portion of the nonlinear distortion component introduced by the second virtual amplifier. The remaining uncancelled portion of the nonlinear distortion component of the second virtual amplifier is used to cancel the nonlinear distortion component of the first virtual amplifier by the feed-forward technique, as subsequently described. The first time delay unit 42 is set so the amplified signal path 24 and the unamplified signal path 26 have approximately or exactly equal propagational time to ensure proper pre-distortion cancellation in the balanced amplifier assembly 46.

Figure 3:
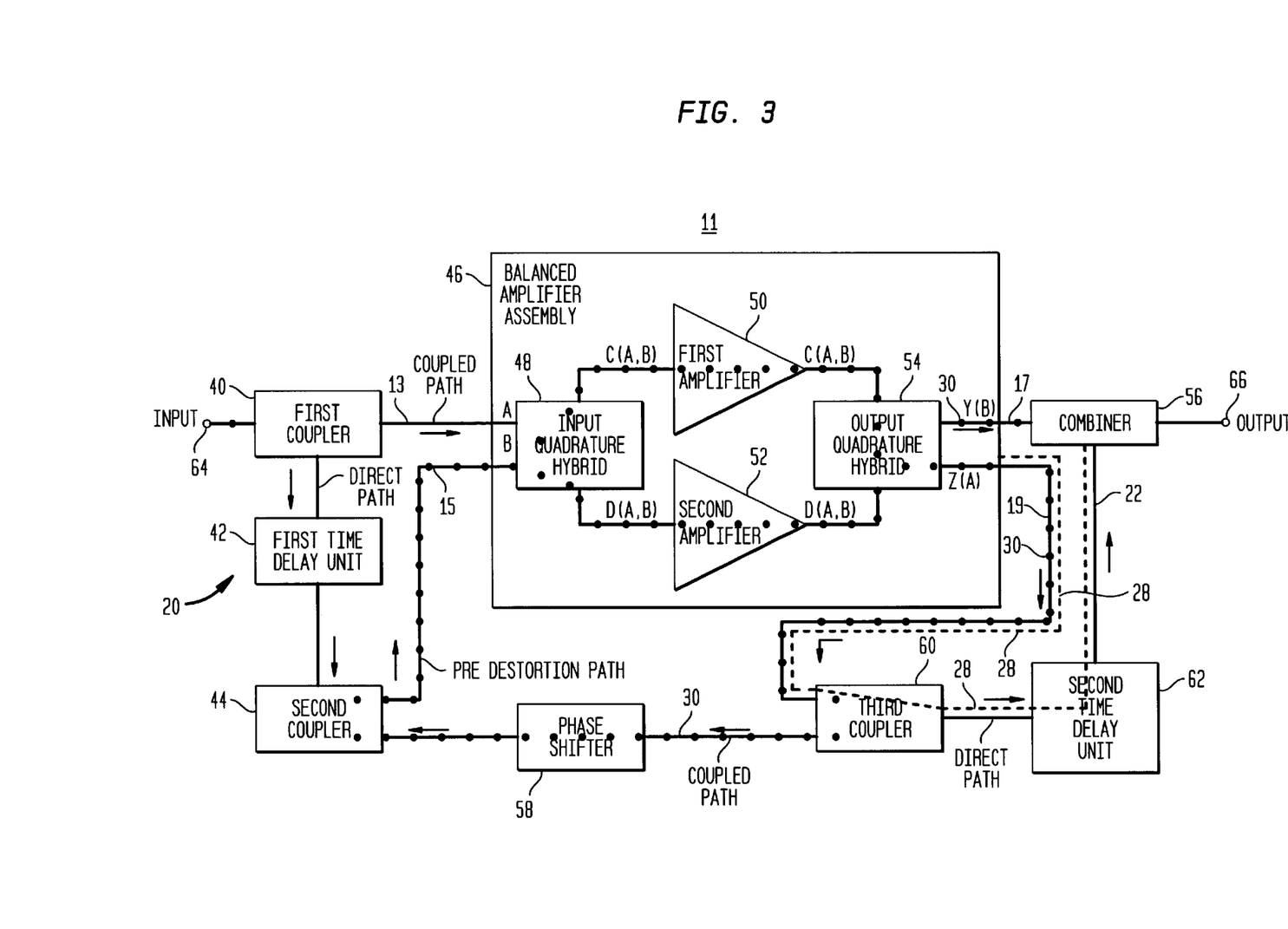
FIG. 3 shows signal paths associated with a feed-forward linearization technique in accordance with the invention.

The feed-forward technique is illustrated by the long signal path 30 (shown as the dotted line) and the short signal path 28 (shown as the dashed line) of FIG. 3. The short signal path 28 starts from the second output port 19 of the balanced amplifier assembly 46, extends through the third coupler 60 and the second time delay unit 62, and terminates within the combiner 56.

The long signal path 30 starts from the second output port 19 of the balanced amplifier. The long signal path 30 extends through the third coupler 60, the phase shifter 58, and the second coupler 44. The long signal path 30 enters the balanced amplifier assembly 46 at the second input port 15. From the second input port 15, the input quadrature hybrid 48 splits the signal for amplification in both the first amplifier 50 and the second amplifier 52. After amplification, the output quadrature hybrid 54 combines the signal and the signal emerges from the balanced amplifier assembly 46 at the first output port 17. The long signal path 30 terminates within the combiner 56.

The short signal path 28 contains the nonlinear distortion component of the first virtual amplifier (input port 13 to output port 19). The long signal path 30 contains a corrective signal component (e.g., feed-forward signal component) presented to the combiner 56 through the first output port 17 of the balanced amplifier assembly 46. The phase shifter 58 shifts a corrective precursor signal component generated by amplification of the first amplifier 50 and the second amplifier 52 to yield a corrective signal component, opposite in phase to the residual nonlinear distortion signal component of the balanced amplifier assembly 46. The corrective signal component and the residual nonlinear signal component preferably entirely cancel one another in the combiner 56. The second time delay unit 62 is set so that the long signal path 30 and the short signal path 28 have approximately or exactly equal propagational time to ensure a proper phase and time relationship necessary for complete cancellation of the residual distortion signal component and the corrective signal component.

The corrective signal component and the residual distortion signal component cancel one another virtually entirely in the combiner 56, leaving a desired signal. The desired signal is formed by desired signal components contributed equally by the first amplifier 50 and the second amplifier 52. Thus, both the first amplifier 50 and the second amplifier 52 participate in the amplification process, efficiently sharing in radio frequency or microwave power amplification, rather than relying on a single powerful amplifier.

The first amplifier 50 and the second amplifier 52 are preferably set at equal gains so that the desired signal presented to the combiner 56 from the first amplifier 50 is approximately equal in amplitude and in phase with the desired signal from the second amplifier 52. Accordingly, constructive interference of the desired signals results from the contributions from the amplification of the balanced amplifier assembly 46. The balanced amplifier assembly 46 includes a first virtual amplifier with a first signal amplification path (from the first input port 13 to the second output port 19) and a second virtual amplifier with a second signal amplification path (from the second input port 15 to the first output port 17). Both the first signal amplification path and the second signal amplification path amplify composite signals with signal components from the signals inputted to the first input port 13 and the second input port 15.

One key feature of the of amplification system 11 is superior cancellation of distortion products because of the identical nonlinear characteristics of amplification obtained through the balanced amplifier assembly 46 promotes virtually complete cancellation of nonlinear distortion components through a combination of the pre-distortion technique and a feed-forward technique. Each amplifier, within the balanced amplifier assembly 46, participates in the creation of nonlinear distortion components, which are subsequently converted into a corrective signal component or a pre-distortion signal component through phase shifting. The same first and second amplification paths are used to generate the corrective signal component as are used to generate the distortion signal component, although the corrective signal component is derived through phase shifting in a predominately or completely linear feedback path. Accordingly, manufacturing and performance variations between the first amplifier 50 and the second amplifier 52 within the balanced amplifier assembly 46 are inconsequential as the signals traverse through both the first and the second amplifier (50, 52) to provide amplification of the first signal path and the second signal path.

The amplifier arrangement also may reduce manufacturing complexity since the first amplifier 50 and the second amplifier 52 may be identical power amplifiers, for example. While the first and second amplifiers (50, 52) may be manufactured according to identical manufacturing processes, absolute identity of the finished product with respect to linearity performance is not realistically attainable. Nevertheless, the manufacturing tolerances among the amplifiers used in the balanced amplifier assembly 46 of the invention are not critical to the uniform linear behavior of the overall amplifier system 11.

Figure 4:
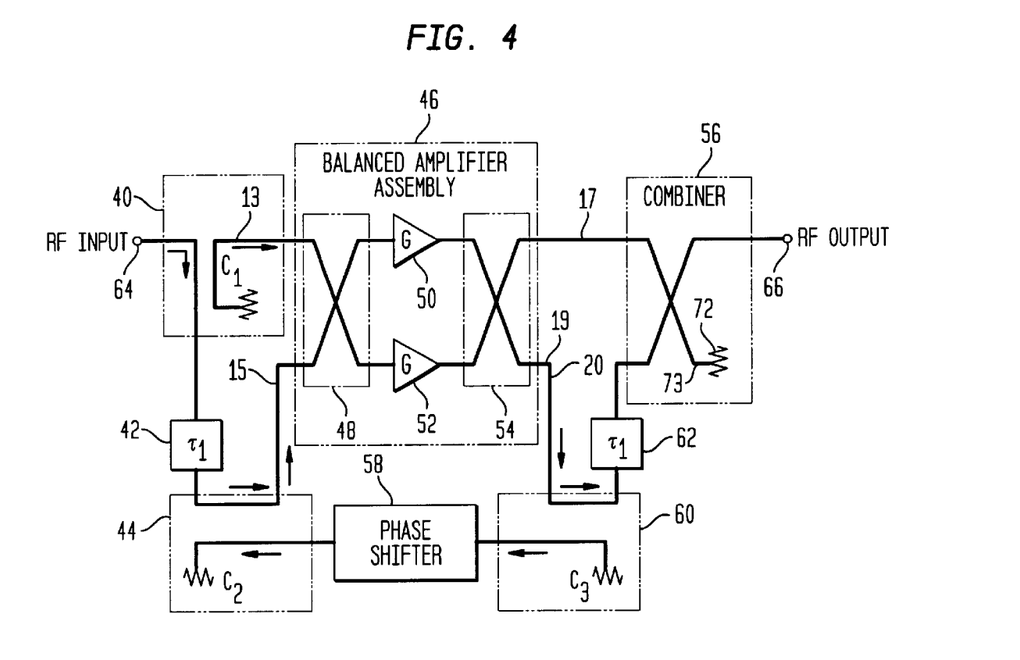
FIG. 4 is an illustrative schematic diagram providing examples of components applicable to the block diagram of FIG. 1.

FIG. 4 provides a schematic of illustrative components that may be used to practice the block diagram of FIG. 1. The input quadrature hybrid 48 is arranged for splitting and shifting the phase of signals applied to different input ports (13, 15) to provide composite signals at output ports (17, 19) based upon the signals. For example, a signal applied to one of the input ports (13, 15) may be equally divided between two output ports (17, 19) and attenuated, while the phase between the composite signals at the output ports (17, 19) represents a 90 degree phase offset from each other. The output quadrature hybrid 54 is preferably identical in structure to the input quadrature hybrid 48. However, the output quadrature hybrid 54 separates the composite signal into amplified versions of the signals supplied to the first input port 13 and the second input port 15 of the input quadrature hybrid 48.

Mathematically, the input quadrature hybrid 48 with input signals A and B produces output signals C and D according to the following equations: $C = A2^{1/2}\angle 0° + B/2^{1/2}\angle -90°$ and $D = B/2^{1/2}\angle 0° + A/2^{1/2}\angle -90°$. If the first amplify second amplifier 52 amplify with approximately equal gain G, the output signals Y and Z at the output quadrature hybrid 54 are $Y = GB\angle 90°$ and $Z = GA\angle -90°$, excluding any impedance, resistance or reactive losses within the quadrature hybrids (48, 54).

The combiner 56 preferably comprises a quadrature hybrid as shown in FIG. 4. A quadrature hybrid may be configured as a three-port combiner 56 by placing a load termination 72 on a remaining port 73. Upon removal of a resistive load termination 72, the remaining port 73 provides an isolated port that can be used to measure balance in the balanced amplifier assembly 46 and to provide feedback to various control elements to maintain that balance.

In an alternate embodiment, the combiner 56 may constitute an arrangement of various different types of couplers and hybrids. For instance, an in-phase combiner and phase adjusters may be used to provide a suitable combiner. An in-phase combiner refers to combiner where the output ports have no or nominal phase offset with respect to each other.

If certain modeling assumptions are made about the components in the schematic of FIG. 4, one may determine an illustrative list of suitable component values for reducing inter-modulation distortion and enhancing linearization. A first modeling assumption provides that the first, second and third directional couplers (40,44, 60) and the input quadrature hybrid 48, the output quadrature hybrid 54, and the combiner 56 exhibit a through-path insertion phase delay of −90 degrees and a coupled-path insertion phase delay of 0 degrees for each signal path. A second modeling assumption provides that components of FIG. 4 other than the first, second, and third couplers (40, 44, 60) and the input quadrature hybrid 48, the output quadrature hybrid 54, and the combiner 56 only have delay with no fixed phase offset. A third modeling assumption provides that the first and second delay elements (42, 62) approximately match the combined delay of the components in the amplified signal path 24 and the long signal path 30, respectively. A fourth modeling assumption provides that the first amplifier 50 and the second amplifier 52 operate in a predominately linear manner, aside from amplification or generation of the nonlinear distortion signal component.

If the above four assumptions are satisfied, the following coupling and the phase shift values represent the best mathematical solution. First, the loss of the first coupler 40 is approximately 10 dB (theoretically 9.99 dB). Second, the sum of the second coupler loss (C2) and the third coupler loss (C3) equals the amplifier gain (G) of the first amplifier 50 or the second amplifier 52 less approximately 6 dB. That is, C2+C3=G−6 dB. Third, the nominal phase shift value for the phase shifter 58 is approximately negative 270 degrees. Finally, the overall gain (Go) from the input 64 to the output 66 of the amplifier system 11, as opposed to balanced amplifier assembly 46 alone, is the amplifier gain of the first amplifier 50 or the second amplifier 52 less 7 dB for values of third coupler 60 loss greater than 20 dB. That is, Go=G−7 dB for C3>20 dB.

The foregoing solution will deviate slightly from the above values when operating with a more than nominally non-linear amplifier for the first amplifier 50 and the second amplifier 52, or with non-ideal circuit elements In practical application, phase and amplitude trimmers may be incorporated into various parts of the illustrative schematic of FIG. 4 to adjust for circuit tolerances as well as the effects of temperature and variable dynamic loading to approach or achieve an optimum reduction of inter-modulation distortion.

Figure 5:
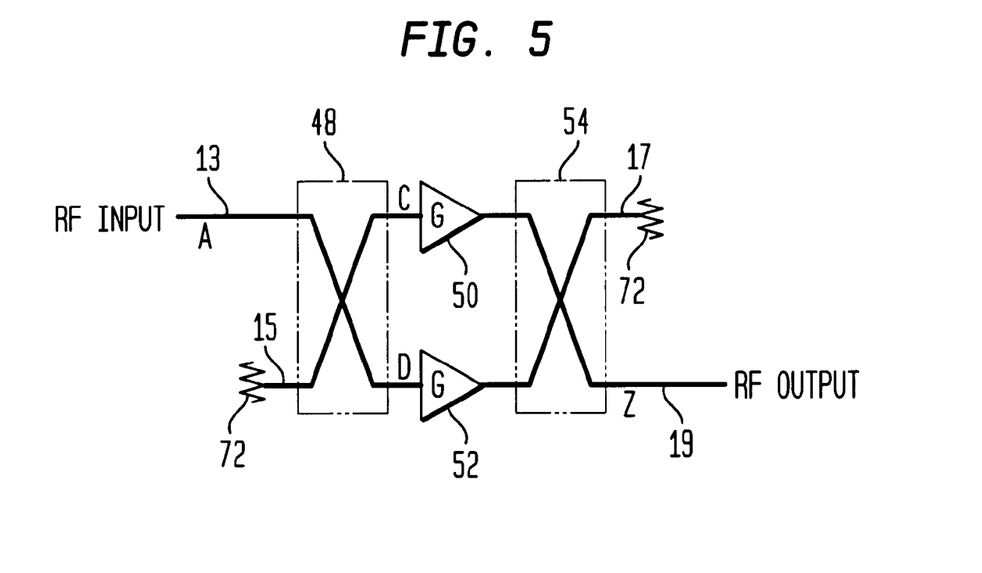
FIG. 5 and FIG. 6 illustrate the operation of a balanced amplifier arrangement of the amplifier system of FIG. 1.
Figure 6:
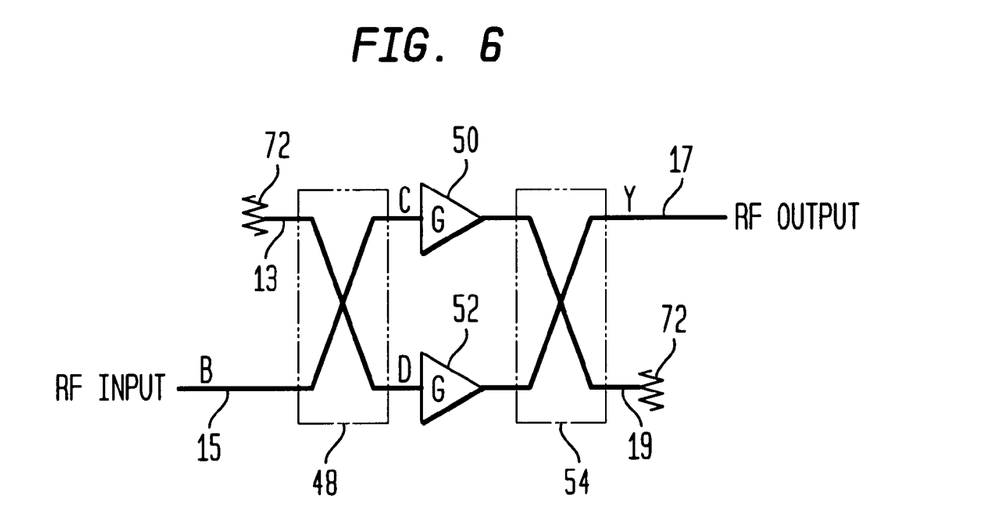

FIG. 5 and FIG. 6 show block diagrams of the balanced amplifier assembly 46 of FIG. 4 with resistive load terminations 72 added. Like reference numerals in FIG. 4 through FIG. 6 indicate like elements. FIG. 5 and FIG. 6 are provided for comparison with each other. Both FIG. 5 and FIG. 6 include resistive load terminations 72 on different or opposite ports and the circuits behave in a symmetrical manner in which the input quadrature hybrid 48 and the output quadrature hybrid 54 may be modeled as three-port splitters or combiners, respectively. In FIG. 5, a desired signal (A) is applied to the first input port 13, while a termination load 72 is on the second input port 15. The output signal (Z as a mathematical function of A) appears on the second output port 19, while the first output port 17 is terminated with a termination load 72.

In FIG. 6, the input and the terminated ports can be swapped relative to FIG. 5 and amplifier performance remains predictable. In FIG. 6, the desired signal (B) is applied to the second input port 15, while a termination load 72 is on the first input port 13. The output signal (Y as a mathematical function of B) appears on the first output port 17, while the second output port 19 is terminated with a termination load 72.

The amplifier system 11 of the invention takes advantage of the foregoing 15 symmetrical performance characteristic of the dual-amplification system 46 by using one port combination of FIG. 5 to implement a parallel set of amplification branches through the first amplifier 50 and the second amplifier 52. An opposite port combination of FIG. 6 is used to implement another parallel set of amplification signal branches through the first and the second amplifier 52. The phasing relationships present in the balanced amplifier assembly 46 creates two separate, but virtually identical composite signal paths through the first amplifier 50 and the second amplifier 52, respectively. The foregoing phasing relationship may facilitate a simple amplifier structure that performs better than other linear amplifiers over temperature and dynamic range because the two composite signal paths are inherently identical by their very definition. Thus, the balanced amplifier assembly 46 produces a corrective precursor signal component that is virtually identical to the nonlinear distortion component to facilitate virtually complete cancellation between a corrective signal component and the nonlinear distortion signal component.

The composite signal paths support feed forward and pre-distortion techniques in reducing inter-modulation distortion. The balanced amplifier assembly 46 supports a feed-forward linearization technique which is applicable to wide-bandwidth (e.g., 1.0 MHz bandwidth or greater), broad-band (e.g., 10 MHz bandwidth or greater), or multi-channel wireless applications. The balanced amplifier 46 supports a pre-distortion linearization technique, which if done properly, does not restrict the operational bandwidth of the dual amplification arrangement 46 over which generally linear performance is attained. Computer simulation has shown the architecture of the invention can yield linear performance over a greater temperature and dynamic range than otherwise possible. The uniform amplification gain is attributable to the inherently identical nature of the composite signal paths through the first amplifier 50 and the second amplifier 52. The amplifier system 11 is well-suited for providing linear amplification of a radio frequency input signal or a microwave input signal and facilitating the reduction of inter-modulation distortion in wireless communication systems.

The specification describes various illustrative embodiments of the invention. The scope of the claims is intended to cover various modifications and equivalent arrangements of the illustrative embodiments disclosed in the specification. For example, the input and output quadrature hybrids may be implemented in various media such as waveguide or microstrip for microwave frequency applications of the invention. Therefore, the following claims should be accorded the reasonably broadest interpretation to cover modifications, equivalent structures, and features which are consistent with the spirit and scope of the invention disclosed herein.

What is claimed is:

1. An amplifier system for a wireless communications device, the amplifier system comprising:
    an input circuit loop;
    a balanced amplifier assembly having input ports coupled to the input circuit loop and output ports, the balanced amplifier assembly providing a nonlinear distortion signal component and a corrective precursor signal component for cancellation of the nonlinear distortion signal component;

an output circuit loop coupled to the output ports of the balanced amplifier assembly; and a phase shifter for phase shifting in a feedback signal path between the output circuit loop and the input circuit loop.

2. The amplifier system according to claim 1 wherein the balanced amplifier assembly includes an input quadrature hybrid and an output quadrature hybrid with phasing relationships selected to emulate two distinct virtual amplifiers between a first pair of the ports and a second pair of the ports.

3. The amplifier system according to claim 2 wherein the first virtual amplifier provides a pre-distortion signal component for the second virtual amplifier via the feedback signal path, the second virtual amplifier providing a corrective signal to the output circuit loop via the feedback signal path.

4. The amplifier system according to claim 1 wherein the amplifier assembly includes a first physical amplifier and a second physical amplifier, wherein both of the physical amplifiers in the dual amplification assembly provide the nonlinear signal component and the corrective precursor signal component.

5. The amplifier system according to claim 1 wherein the corrective precursor signal component comprises a raw distortion signal from the amplifier assembly prior to inverting the phase of the raw distortion signal to form a corrective signal component selected from the group consisting of a pre-distortion signal component and a feed-forward signal component.

6. The amplifier system according to claim 1 wherein the amplifier assembly further comprises:
  a first amplifier having a first amplifier input and a first amplifier output;
  a second amplifier having a second amplifier input and a second amplifier output;
  an input quadrature hybrid coupled to the first amplifier input and the second amplifier input, output ports of the input quadrature hybrid being offset in phase by approximately ninety degrees from one another;
  an output quadrature hybrid coupled to the second amplifier input and the second amplifier output, output ports of the output quadrature hybrid being offset in phase by approximately ninety degrees from one another.

7. The amplifier system according to claim 1 wherein the input loop further comprises:
  a first coupler having one output coupled to first time delay unit and another output coupled to a first input port of the balanced amplifier assembly;
  a second coupler having inputs coupled to the first time delay unit and the phase shifter and an output coupled to a second input port of the balanced amplifier assembly.

8. The amplifier system according to claim 1 wherein the output loop further comprises:
  a combiner having an input coupled to a first output of a balanced amplifier assembly;
  a third coupler having an input coupled to a second output of the balanced amplifier assembly;
  a second time delay unit coupled between an output of the third coupler and an input of the combiner.

9. The amplifier system according to claim 1 wherein the input loop includes a first time delay unit with a time delay for equalizing the propagational delay between an amplified path through the amplifier assembly and an unamplified path through the input loop.

10. The amplifier system according to claim 1 wherein the output loop includes a second time delay unit with a time delay for equalizing the propagational delay between a long path through the amplifier assembly and a short path through the output loop.

11. The amplifier system according to claim 1 wherein the amplifier assembly includes a first amplifier with a gain and a second amplifier with approximately the same gain.

12. An amplifier system for a wireless communications device, the amplifier system comprising:
  a balanced amplifier assembly having a first input, a second input, a first output, and a second output and providing a nonlinear distortion signal component and a corrective precursor signal for cancellation of the nonlinear distortion component;
  a first time delay unit;
  a first coupler having one output coupled to the first time delay unit and another output coupled to a first input port of the balanced amplifier assembly;
  a second coupler having inputs coupled to the first time delay unit and the phase shifter and an output coupled to a second input port of the balanced amplifier assembly;
  a combiner having an input coupled to a first output of a balanced amplifier assembly;
  a third coupler having an input coupled to a second output of the balanced amplifier assembly;
  a second time delay unit coupled between an output of the third coupler and an input of the combiner; and
  a phase shifter for phase shifting in a feedback signal path between the second coupler and the third coupler.

13. The amplifier system according to claim 12 wherein the balanced amplifier assembly includes an input quadrature hybrid and an output quadrature hybrid with phasing relationships selected to emulate two distinct virtual amplifiers between the first input port and the second output port and between the second input port and the first output port.

14. The amplifier system according to claim 13 wherein the first virtual amplifier provides a pre-distortion signal component for the second virtual amplifier via the feedback signal path, the second virtual amplifier providing a corrective signal to the output circuit loop via the feedback signal path.

15. The amplifier system according to claim 12 wherein the amplifier assembly includes a first physical amplifier and a second physical amplifier, wherein both of the physical amplifiers in the dual amplification assembly provide the nonlinear signal component and the corrective precursor signal.

16. The amplifier system according to claim 12 wherein the corrective precursor signal comprises a raw distortion signal from the amplifier assembly prior to inverting the phase of the raw distortion signal to form a corrective signal selected from the group consisting of a pre-distortion signal component and a feed-forward signal component.

17. The amplifier system according to claim 12 wherein the amplifier assembly further comprises:
  a first amplifier having a first amplifier input and a first amplifier output;
  a second amplifier having a second amplifier input and a second amplifier output;
  an input quadrature hybrid coupled to the first amplifier input and the second amplifier input, output ports of the input quadrature hybrid being offset in their phase response by approximately ninety degrees from one another;

an output quadrature hybrid coupled to the second amplifier input and the second amplifier output, output ports of the output quadrature hybrid being offset in their phase response by approximately ninety degrees from one another.

18. The amplifier system according to claim 12 wherein the first time delay unit has a time delay for equalizing the propagational delay between an amplified path through the amplifier assembly and an unamplified path through the input loop.

19. The amplifier system according to claim 12 wherein the output loop includes a second time delay unit with a time delay for equalizing the propagational delay between a long path through the amplifier assembly and a short path through the output loop.

20. The amplifier system according to claim 12 wherein the amplifier assembly includes a first amplifier with a gain and a second amplifier driven with approximately the same gain.

* * * * *